United States Patent
Park et al.

(10) Patent No.: US 10,734,790 B2
(45) Date of Patent: Aug. 4, 2020

(54) COMPOSITE ELECTRONIC COMPONENT AND MANUFACTURING METHOD OF THE SAME

(71) Applicant: SAMSUNG ELECTRO-MECHANICS CO., LTD., Suwon-si, Gyeonggi-do (KR)

(72) Inventors: Hye Hun Park, Suwon-si (KR); Kwang Jik Lee, Suwon-si (KR); Ju Hwan Yang, Suwon-si (KR); Jung Wook Seo, Suwon-si (KR); Sang Moon Lee, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 396 days.

(21) Appl. No.: 15/728,104

(22) Filed: Oct. 9, 2017

(65) Prior Publication Data
US 2018/0175591 A1    Jun. 21, 2018

(30) Foreign Application Priority Data
Dec. 16, 2016 (KR) .................. 10-2016-0172626

(51) Int. Cl.
*H01T 4/02* (2006.01)
*H01T 21/00* (2006.01)
*H01T 4/08* (2006.01)
*H01T 4/12* (2006.01)
*H01L 27/02* (2006.01)

(52) U.S. Cl.
CPC ............ *H01T 4/02* (2013.01); *H01L 27/0288* (2013.01); *H01T 4/08* (2013.01); *H01T 4/12* (2013.01); *H01T 21/00* (2013.01)

(58) Field of Classification Search
CPC .............................. H01T 4/02; H01L 27/0288
See application file for complete search history.

(56) References Cited

U.S. PATENT DOCUMENTS

2009/0116165 A1* 5/2009 Tokunaga ............. H01C 1/146
361/220
2011/0002075 A1  1/2011 Asakawa et al.
2011/0007439 A1* 1/2011 Asakawa ............ H01F 17/0006
361/56

FOREIGN PATENT DOCUMENTS

JP    2012/033976 A    2/2012
JP    2013/098259 A    5/2013

* cited by examiner

*Primary Examiner* — Scott Bauer
(74) *Attorney, Agent, or Firm* — Morgan, Lewis & Bockius LLP

(57) ABSTRACT

A composite electronic component includes an element part and an electrostatic discharge (ESD) protection part disposed on the element part. The ESD protection part includes first and second discharge electrodes having a gap formed therebetween, a discharge layer disposed between the first and second discharge electrodes and in the gap, and a multilayer insulating layer covering the discharge layer and including at least two insulating layers having different breakdown voltage (BDV) values.

14 Claims, 3 Drawing Sheets

COMPOSITE ELECTRONIC COMPONENT AND MANUFACTURING METHOD OF THE SAME

CROSS-REFERENCE TO RELATED APPLICATION

This application claims priority under 35 U.S.C. § 119 to Korean Patent Application No. 10-2016-0172626, filed on Dec. 16, 2016, with the Korean Intellectual Property Office (KIPO), the entirety of which is incorporated herein by reference.

BACKGROUND

1. Field

Embodiments disclosed relate to a composite electronic component and a manufacturing method of the same and, more particularly, to a composite electronic component having improved insulating properties, and a manufacturing method thereof.

2. Description of Related Art

A recent development in the realm of portable electronic devices is making the cases of the portable electronic devices of conductive metals. These metallic cases make the portable electronic device aesthetically more pleasing and protect it from external impacts, stresses, etc.

When using a metallic case, it is required to prevent users from experiencing electrical shocks from the currents or voltages generated in the device and transmitted to the metallic case of the electronic device. In addition, it may also be required to protect the electronic components of the device from external electrostatic discharge (ESD) generated due to the internal power of the device.

However, due to the miniaturization and integration of portable electronic devices, it has been difficult to create a separate ESD protection element or an electric shock protection element.

An ESD protection function is built in a small chip such as a common mode filter (CMF) in order to withstand voltage reliability in portable electronic devices.

However, as an additional ESD protection part is built in the small chip, it is difficult to achieve the filtering characteristics of the CMF itself while ensuring reliability and, insulating properties may be reduced.

SUMMARY

An aspect of the present disclosure may provide a composite electronic component having improved insulating properties and a manufacturing method of the same.

Another aspect of the present disclosure may provide a method for manufacturing a composite electronic component having improved insulating properties and having an electrostatic discharge (ESD) protection component.

According to an aspect of the present disclosure, a composite electronic component may include an element part and an electrostatic discharge (ESD) protection part disposed on the element part. The ESD protection part may include first and second discharge electrodes having a gap formed therebetween, a discharge layer disposed between the first and second discharge electrodes and in the gap, and a multilayered insulating layer covering the discharge layer.

The multilayered insulating layer may include at least two insulating layers having different breakdown voltage (BDV) values.

According to another aspect of the present disclosure, a method of manufacturing a composite electronic component may include providing an element part, forming first and second discharge electrodes on the element part and having a gap therebetween, forming a discharge layer in the gap, and a multilayered insulating film to the discharge layer. The multilayered insulating film including at least two layers having different BDV values.

BRIEF DESCRIPTION OF DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure

DETAILED DESCRIPTION

Figure 1:
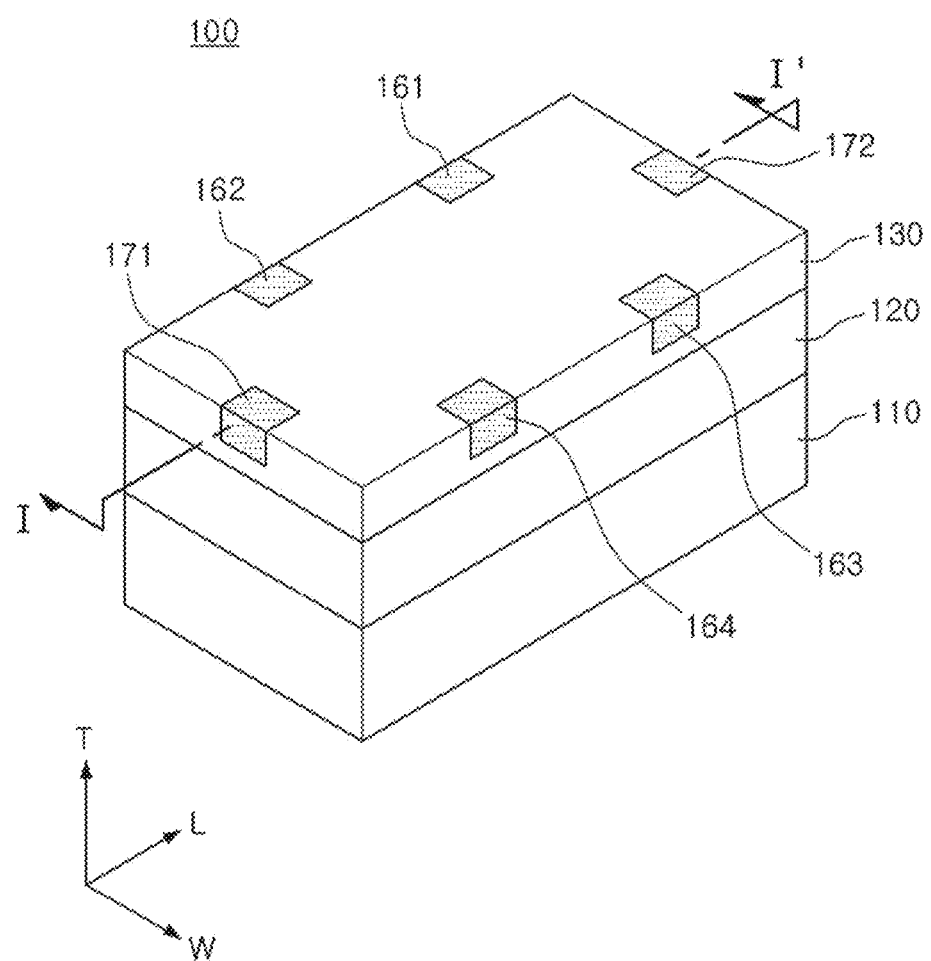
FIG. 1 is a perspective view of an electronic component according to an exemplary embodiment.

Hereinafter, embodiments of the present disclosure will be described with reference to the attached drawings.

Embodiments disclosed are not limited to the specific embodiments set forth herein, and may be modified according to application and design requirement, without departing from the scope of the disclosure. Rather, these embodiments are provided so that this disclosure will be thorough and complete, and will fully convey the scope of the disclosure to those skilled in the art.

As used in the specification, it will be understood that when an element, such as a layer, region or wafer (substrate), is referred to as being "on," "connected to," or "coupled to" another element, it can be directly "on," "connected to," or "coupled to" the other element, or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated, listed items.

It will be apparent that, although the terms 'first,' 'second,' 'third,' etc. may be used herein to describe various members, components, regions, layers and/or sections, these members, components, regions, layers and/or sections should not be limited by these terms. These terms are only used to distinguish one member, component, region, layer or section from another member, component, region, layer or section. Thus, a first member, first component, first region, first layer or first section discussed herein could be termed a second member, second component, second region, second layer or second section, without departing from the scope of the disclosure.

Spatially relative terms, such as "above," "upper," "below," and "lower" or the like, may be used herein for ease of description to describe a relationship of an element relative to another element(s). It will be understood that spatially relative terms are intended to encompass different orientations of the device in use or operation, in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations, depending on a particular directional orientation of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape resulting from manufacturing. The following embodiments may also be constituted alone or as a combination of several or all thereof.

The contents of the present disclosure described below may have a variety of configurations, and only one of the many configurations is disclosed herein, but the present disclosure is not limited thereto.

An element part of a composite electronic component according to the present disclosure may be a common mode filter (CMF), a capacitor, an inductor, or a thermistor, but is not limited thereto.

However, for the sake of description, an example common mode filter is described.

Composite Electronic Component

FIG. 1 is a perspective view of a composite electronic component 100 according to an exemplary embodiment, and FIG. is a cross-sectional view of the composite electronic component 100 taken along line I-I' of FIG. 1.

Figure 2:
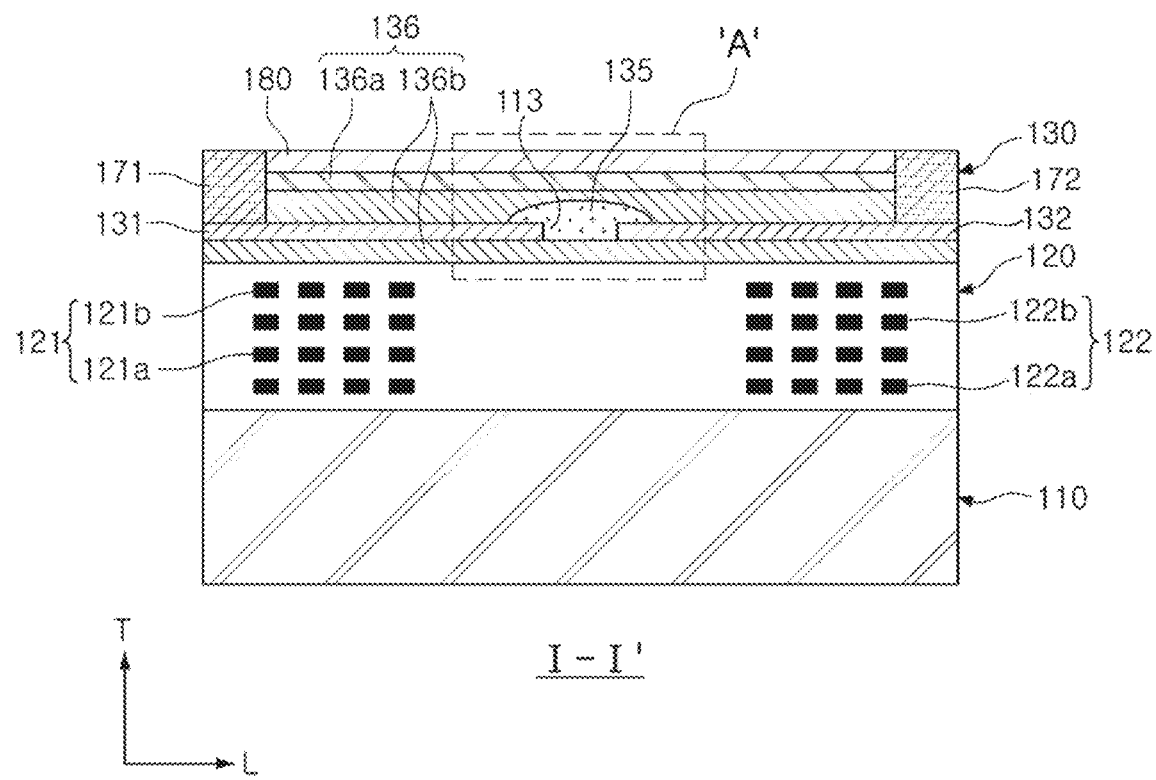
FIG. 2 is a cross-sectional view of the electronic component taken along line I-I' of FIG. 1.

Referring to FIGS. 1 and 2, the composite electronic component 100 according to an exemplary embodiment may include an element part having a substrate 110, a filter part 120, and an electrostatic discharge (ESD) protection part 130.

The element part may be a common mode filter, wherein the filter part 120 disposed on the substrate 110 may include a first coil 121 and a second coil 122.

The substrate 110 may be or include a magnetic material, for example, a ferrite substrate.

The first coil 121 may be formed by connecting a 1-1-th coil 121a and a 1-2-th coil 121b to each other with a conductive via (not expressly illustrated), and the second coil 122 may be formed by connecting a 2-1-th coil 122a and a 2-2-th coil 122b to each other with the conductive via.

First and third external electrodes 161 and 163 may be electrically connected to the first coil 121, and second and fourth external electrodes 162 and 164 may be electrically connected to the second coil 122.

The composite electronic component 100 may have inductance and capacitance provided by the respective coils, connected as described above, and noise of a common mode signal may be attenuated using the inductance and capacitance.

When current flows into the common mode filter, due to an overvoltage or static electricity, the common mode filter may be damaged or destroyed. Therefore, an apparatus or a configuration capable of preventing the damage may be provided.

Since the composite electronic component, according to an exemplary embodiment, has the ESD protection part disposed on the element part, the composite electronic component may have high durability against the current caused by the overvoltage or static electricity. Thus, reliability of the composite electronic component may be improved.

As illustrated, the ESD protection part 130 may be disposed on the filter part 120.

The ESD protection part 130 may include first and second discharge electrodes 131 and 132 disposed on the filter part 120, and the first and second discharge electrodes 131 and 132 may be formed using a conductive paste. In an example and as illustrated, the first and second discharge electrodes 131 and 132 may be disposed in the same plane (coplanar) and a gap 113 may be defined therebetween. The first and second discharge electrodes 131 and 132 may be electrically connected to first and second external electrodes 171 and 172 for the ESD protection part, respectively. The first and second discharge electrodes 131 and 132 may have thicknesses of about 12 μm to about 18 μm.

A discharge layer 135 may be disposed between the first and second discharge electrodes 131 and 132 and in the gap 113.

Figure 3:
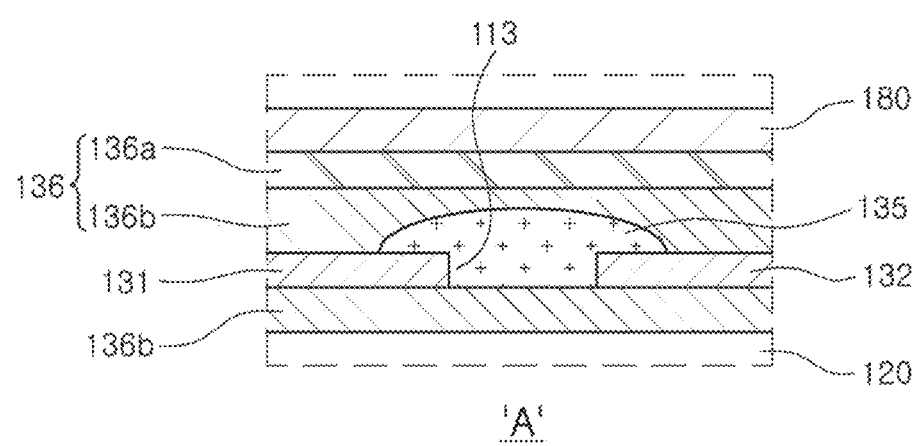
FIG. 3 is an enlarged view of region A of FIG. 2.

FIG. 3 is an enlarged view of region A of FIG. 2. Referring to FIG. 3, the discharge layer 135 may be disposed at or adjacent end portions of the first and second discharge electrodes 131 and 132 that define the gap 113 and may cover the end portions. As discussed below, since the discharge layer 135 covers the end portions of the first and second discharge electrodes 131 and 132, an electric field may be prevented from being focused on corners of the end portions of the first and second discharge electrodes 131 and 132 when the overvoltage or static electricity flows through the first and second discharge electrodes 131 and 132 and the discharge layer 135. Thus, durability and reliability of the composite electronic component may be improved.

The discharge layer 135, which is a composite of a conductive metal powder and a resin, may operate as an insulator at a predetermined voltage level or lower, but may provide a conductive path due to the presence of the conductive metal powder for current to flow during presence of overvoltage or static electricity. Thus, the overvoltage or static electricity may be prevented from flowing into the element part.

According to an exemplary embodiment, the composite electronic component may include a multilayer (2 layers, in this case) insulating layer 136 covering the discharge layer 135 and each layer may have a different breakdown voltage (BDV) value.

A magnetic layer 180 that may include a cover region of the element part may be disposed on the multilayer insulating layer 136.

The multilayer insulating layer 136 may include a first insulating layer 136a in contact with the magnetic layer 180 and a second insulating layer 136b in contact with the discharge layer 135, and the first and second discharge electrodes 131 and 132. The first insulating layer 136a may have the BDV value higher than the BDV value of the second insulating layer 136b.

In the ESD protection part in the related art, the discharge layer including the conductive metal powder in an epoxy resin is disposed between the first and second discharge electrodes, and an insulating film is disposed on the discharge layer. As a result, insulating properties are increased. The discharge layer may operate as an insulating layer, but may provide a path through which the current may flow during overvoltage or static electricity conditions.

However, there the insulating properties of the insulating layer including a single layer may be a drawback.

Such insulating properties may be determined according to a BDV value and a thickness of the insulating layer, and there are problems in achieving the filtering characteristics of the CMF, ensuring reliability, and increasing the insulating properties.

The ESD protection part 130 of the composite electronic component according to an exemplary embodiment may have the discharge layer 135 disposed between the first and second discharge electrodes 131 and 132. The multilayer insulating layer 136 having the different BDV values may be provided as an insulating layer covering the discharge layer 135, as opposed to the insulating layer used in the related art. Thus, the ESD protection part 130 may delay or otherwise impede the formation of a leakage current path, and thereby increase the insulating properties of the composite electronic component.

In particular, the first insulating layer 136a in contact with the magnetic layer 180 may have the BDV value higher than the BDV value of the second insulating layer 136b in contact with the discharge layer 135 and this may prevent the leakage current path from reaching the magnetic layer. As a result, insulating properties may be increased.

The second insulating layer 136b in contact with the discharge layer 135 and the first and second discharge electrodes 131 and 132 may be formed using the conventional insulating film deposition (or formation) techniques, but a method of forming the second insulating layer 136b is not particularly limited thereto.

Subsequently, the first insulating layer 136a in contact with the magnetic layer 180 may be configured to have a BDV value higher than a BDV value of the second insulating layer 136b. The BDV values of the first and/or second insulating layer 136a, 136b may be modified by controlling a content of silica included therein.

For example, a silica content of the second insulating layer 136b may be increased to be higher than that of the first insulating layer 136a, and thus the BDV value of the first insulating layer 136a may be further increased.

As discussed above, the multilayer insulating layer 136 having the different BDV values may be disposed on the discharge layer 135 of the ESD protection part 130. In particular, the multilayer insulating layer 136 may include the first insulating layer 136a in contact with the magnetic layer 180 and the second insulating layer 136b in contact with the discharge layer 135. By increasing the BDV value of the first insulating layer 136a to be higher than that of the second insulating layer 136b, the formation of the leakage current path may be delayed (or impeded) in the first insulating layer 136a, and the insulating properties of the composite electronic component may thereby be increased.

According to an exemplary embodiment, the first insulating layer 136a may have a thickness of 3 μm to 10 μm.

As discussed above, insulating properties of the ESD protection part 130 in the composite electronic component may be determined according to a thickness of the insulating layer disposed on the discharge layer 135 and, in particular, the first insulating layer 136a may be required to have a predetermined thickness in order to achieve (or otherwise maintain) the filtering characteristics of the CMF, ensure reliability, and increase the insulating properties.

Specifically, the thickness of the first insulating layer 136a may range from 3 μm to 10 μm, which may delay the formation of the leakage current path, and thereby increase insulating properties of the composite electronic component.

When the first insulating layer 136a has a thickness less than 3 μm, a leakage current value may exceed a threshold (or specified) value, and insulating properties of the composite electronic component may be reduced.

When the first insulating layer 136a has a thickness greater than 10 μm, the leakage current value may be low, but the filtering characteristics of the CMF may be poor and, thereby the reliability may be poor.

Table 1 below compares thicknesses of the first insulating layer 136a with leakage current values.

A required threshold value of leakage current value may be less than or equal to 13.5 μA, and preferably, 10.5 μA or less.

TABLE 1

| | Thickness of First Insulating Layer 136a (μm) | | | | |
|---|---|---|---|---|---|
| | 0 | 3 | 5 | 7 | 10 |
| Leakage Current (μA) | 15.5 | 13.1 | 10.4 | 9.2 | 7.5 |

Referring to Table 1 above, when the thickness of the first insulating layer 136a is less than 3 μm, the leakage current value may be higher than the required threshold value. For example, when the first insulating layer 136a is absent (thickness is 0 μm), the leakage current value may be about 15.5 μA, which is higher than the threshold value. As indicated in Table 1, when the first insulating layer 136a has the thickness of about 3 μm to about 10 μm, the leakage current value may meet the threshold requirements.

As can be understood, when the thickness of the first insulating layer 136a is greater than or equal to 5 μm, desired insulating properties may be obtained.

Figure 4:
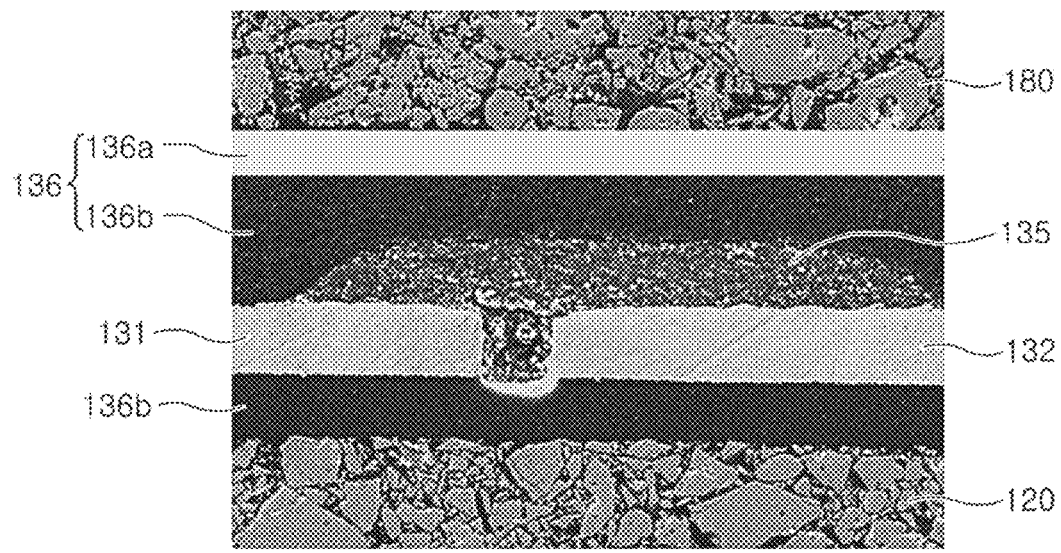
FIG. 4 is a cross-sectional image of a structure of an ESD protection part in a composite electronic component according to an exemplary embodiment.

FIG. 4 is a cross-sectional image of a structure of an ESD protection part in a composite electronic component according to an exemplary embodiment.

Referring to FIG. 4, illustrated is a structure in which a multilayer insulating layer 136 having different BDV values may be disposed on a discharge layer 135 and, in particular, the multilayer insulating layer 136 may include a first insulating layer 136a in contact with a magnetic layer 180 and a second insulating layer 136b in contact with the discharge layer 135.

Method of Manufacturing Composite Electronic Component

Figure 5:
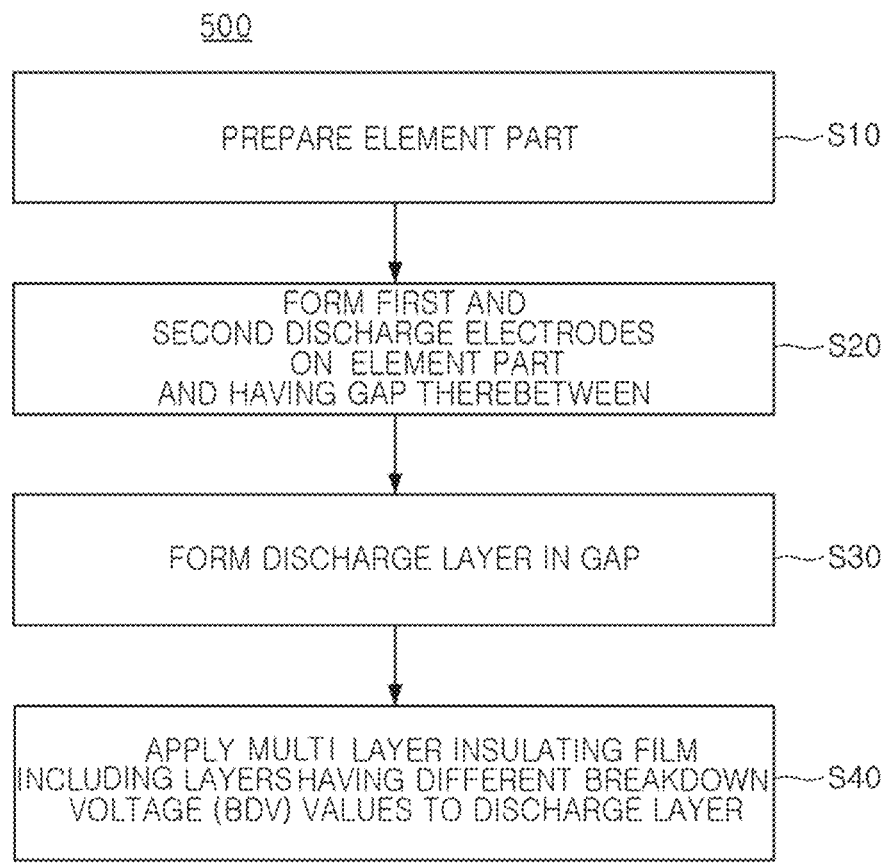
FIG. 5 is a flowchart illustrating a method for manufacturing a composite electronic component according to another exemplary embodiment.

FIG. 5 is a flowchart of a method 500 of manufacturing a composite electronic component according to an exemplary embodiment.

Referring to FIG. 5, the method 500 may include an operation (S10) of providing an element part, an operation (S20) of forming first and second discharge electrodes on the element part and separated by a gap defined therebetween, an operation (S30) of forming a discharge layer in the gap, and an operation (S40) of applying a multilayered insulating film having two or more insulating layers having different BDV values to the discharge layer.

First, the operation (S10) of providing the element part may be performed. The operation (S10) of providing the element part may generally be performed using a method of manufacturing a CMF. However, the operation (S10) may not provide a completed element, may provide an element having basic functionality.

Subsequently, the operation (S20) of forming the first and second discharge electrodes on the element part may be performed. In an example, the operation (S20) of forming the first and second discharge electrodes may be performed by printing a conductive paste. The operation (S20) of forming the first and second discharge electrodes may include forming the gap between the first and second discharge electrodes.

After forming of the first and second discharge electrodes, the operation (S30) of forming the discharge layer in the gap between the first and second discharge electrodes may be performed. The discharge layer may include a conductive polymer, but is not limited thereto, and may also be a composite including a conductive powder and an epoxy resin. The conductive polymer may be, for example, a silicone-based resin, but is not particularly limited thereto.

Subsequently, the operation (S40) of applying the multilayered insulating film including two (or more) having different BDV values to the discharge layer may be performed.

The multilayered insulating film may include a first insulating film in contact with a magnetic layer disposed thereon and a second insulating film in contact with the discharge layer, and the first insulating film may have the BDV value higher than that of the second insulating film.

The second insulating film in contact with the discharge layer may be formed using conventional insulating film deposition (or formation) techniques, but a method of forming the second insulating film is not particularly limited thereto.

Subsequently, the first insulating film in contact with the magnetic layer may be adjusted to have the BDV value higher than that of the second insulating film, and the BDV value of the first or second insulating film may be adjusted by controlling a content of silica included therein.

In particular, the second insulating film may be configured to have a silica content higher than that of the first insulating film, and thus the BDV value of the first insulating film may be increased to be higher than the second insulating film.

As set forth above, according to an exemplary embodiment, a composite electronic component may include a multilayer insulating layer disposed on a discharge layer of an electrostatic discharge (ESD) protection part and having at least two insulating layers having different breakdown voltage (BDV) values. For example, the multilayer insulating layer may include a first insulating layer in contact with a magnetic layer and a second insulating layer in contact with the discharge layer. The first insulating layer may have the BDV value higher than that of the second insulating layer. As a result, the composite electronic component may delay or otherwise impede the formation of a leakage current path, thus improving insulating properties.

While exemplary embodiments have been shown and described above, it will be apparent to those skilled in the art that modifications and variations could be made without departing from the scope of the present invention, as defined by the appended claims.

What is claimed is:

1. A composite electronic component, comprising:
an element part and an electrostatic discharge (ESD) protection part disposed on the element part,
wherein the ESD protection part includes:
first and second discharge electrodes having a gap formed therebetween;
a discharge layer disposed between the first and second discharge electrodes and in the gap; and
a multilayer insulating layer covering the discharge layer, the multilayer insulating layer including a first insulating layer and a second insulating layer,
wherein the second insulating layer is arranged between the first insulating layer and the discharge layer in a thickness direction of the composite electronic component, and
wherein the first insulating layer has a breakdown voltage (BDV) value higher than a BDV value of the second insulating layer.

2. The composite electronic component of claim 1, wherein a magnetic layer including a cover region of the element part is disposed on the multilayer insulating, layer.

3. The composite electronic component of claim 2, wherein the first insulating layer is in contact with the magnetic layer and the second insulating layer is in contact with the discharge layer.

4. The composite electronic component of claim 1, wherein the first insulating layer has a thickness of about 3 μm to about 10 μm.

5. The composite electronic component of claim 1, wherein the element part is a common mode filter.

6. The composite electronic component of claim 1, further comprising a third insulating layer arranged between the discharge layer and the element part in the thickness direction.

7. The composite electronic component of claim 6, wherein the BDV value of the first insulating layer is higher than a BDV value of the third insulating layer.

8. A method of manufacturing a composite electronic component, the method comprising:
providing an element part;
forming first and second discharge electrodes on the element part, a gap being defined between the first and second discharge electrodes;
forming a discharge layer in the gap; and
applying a multilayered insulating film to the discharge layer, the multilayered insulating film including a first insulating film and a second insulating film,
wherein the second insulating film is arranged between the first insulating film and the discharge layer in a thickness direction of the composite electronic component, and
wherein the first insulating film has a breakdown voltage (BDV) value higher than a BDV value of the second insulating film.

9. The method of claim 8, wherein a magnetic layer including a cover region of the element part is disposed on the insulating film.

10. The method of claim 9, wherein the first insulating film is in contact with the magnetic layer and the second insulating film is in contact with the discharge layer.

11. The method of claim 8, wherein the first insulating film has a thickness of about 3 μm to about 10 μm.

12. The method composite electronic component of claim 8, wherein the providing the element part includes manufacturing a common mode filter.

13. The method of claim 8, further comprising forming a third insulating film between the discharge layer and the element part in the thickness direction.

14. The method of claim 13, wherein the BDV value of the first insulating film is higher than a BDV value of the third insulating film.

* * * * *